(12) United States Patent
Koerber et al.

(10) Patent No.: US 6,924,430 B2
(45) Date of Patent: Aug. 2, 2005

(54) ACTUATING ELEMENT COMPRISING A LOCKING ELEMENT FOR INSERTING AND REMOVING FLAT MODULES BY LEVERAGE IN A LEAST THREE CONNECTION POSITIONS, FRONT ELEMENT FOR A FLAT MODULE, COMPRISING AN ACTUATING ELEMENT AND A SUBASSEMBLY SUPPORT FOR RECEIVING FLAT MODULES

(75) Inventors: Werner Koerber, Betzenstein (DE); Kurt Michael Schaffer, Eckental (DE); Ralf Behrens, Nürnberg (DE)

(73) Assignee: Rittal Electronics Systems GmbH & Co. KG, Herborn (DE)

( * ) Notice: Subject to any disclaimer, the term of this patent is extended or adjusted under 35 U.S.C. 154(b) by 135 days.

(21) Appl. No.: 10/343,526

(22) PCT Filed: Aug. 17, 2001

(86) PCT No.: PCT/EP01/09522

§ 371 (c)(1),
(2), (4) Date: Jul. 18, 2003

(87) PCT Pub. No.: WO02/15656

PCT Pub. Date: Feb. 21, 2002

(65) Prior Publication Data

US 2004/0099072 A1 May 27, 2004

(30) Foreign Application Priority Data

Aug. 17, 2000 (DE) .................................... 200 14 195 U

(51) Int. Cl.$^7$ .................................................. H05K 5/00
(52) U.S. Cl. .................... 174/52.4; 174/52.1; 361/754; 361/759; 361/801
(58) Field of Search .............................. 174/52.4, 52.1; 361/740, 748, 754, 759, 798, 801, 802; 439/157, 160, 911

(56) References Cited

U.S. PATENT DOCUMENTS

| | | | |
|---|---|---|---|
| 4,885,436 A | | 12/1989 | Pham et al. |
| 4,917,618 A | * | 4/1990 | Behrens et al. ............. 439/157 |
| 5,675,475 A | * | 10/1997 | Mazura et al. .............. 361/798 |
| 5,940,276 A | * | 8/1999 | Kurrer et al. ............... 361/754 |
| 5,959,843 A | | 9/1999 | Kurrer et al. |
| 6,094,353 A | * | 7/2000 | Koerber et al. ............. 361/754 |
| 6,128,198 A | * | 10/2000 | Kurrer et al. ............... 361/759 |
| 6,741,479 B2 | * | 5/2004 | Korber et al. .............. 361/801 |

FOREIGN PATENT DOCUMENTS

| | | |
|---|---|---|
| DE | 31 47 056 A1 | 6/1983 |
| DE | 298 23 122 U1 | 4/1999 |
| DE | 299 22 725 U1 | 4/2001 |
| EP | 0 313 270 A2 | 4/1989 |

* cited by examiner

Primary Examiner—Dean A. Reichard
Assistant Examiner—Carmelo Oliva
(74) Attorney, Agent, or Firm—Pauley Petersen & Erickson

(57) ABSTRACT

An actuating element for inserting and removing a flat module by leverage, the element having an end piece designed to be connected to a flat module. An actuating lever, which is pivotally mounted on the end piece, has at least one grip section and a locking element, which can be displaced, particularly slid between two connection positions. In a first connection position, the actuating lever retains the flat module in its inserted state and in a second connection position, the actuating lever is released to remove the module by leverage. The actuating element has a connecting element, which is activated in the first connection position of the locking element, which can be displaced into a third connection position, in which the actuating lever is retained in the first position, corresponding to the inserted state of the flat module and in which the connecting element is disconnected.

16 Claims, 3 Drawing Sheets

ACTUATING ELEMENT COMPRISING A LOCKING ELEMENT FOR INSERTING AND REMOVING FLAT MODULES BY LEVERAGE IN A LEAST THREE CONNECTION POSITIONS, FRONT ELEMENT FOR A FLAT MODULE, COMPRISING AN ACTUATING ELEMENT AND A SUBASSEMBLY SUPPORT FOR RECEIVING FLAT MODULES

BACKGROUND OF THE INVENTION

1. Field of the Invention

This invention relates to an actuating element for inserting and removing flat modules with locking elements by leverage into at least three switched positions. This invention also relates to a front system for a flat module having at least one such actuating element, an associated flat module, as well as a component support for receiving such flat modules with a front system, which can be inserted and removed by leverage.

2. Discussion of Related Art

An actuating element for inserting and removing flat modules with an end element by leverage is known as the prior art from German Utility Model 299 22 725.1, which can be connected with a flat module and which has an actuating lever, which is rotatably seated at the end element.

The actuating element has a locking element which allows the removal of the actuating element by leverage in one switched position, and prevents this in another switched position. A defined actuation or relief of a positioning element integrated into an end element of such an actuating element does not occur.

SUMMARY OF THE INVENTION

One object of this invention is to provide an actuating element for inserting and removing a flat module by leverage, which allows a defined actuation or relief of an integrated positioning element. This invention also provides an associated front system for such a flat module, a flat module with such a front system, as well as a component support for receiving such flat modules, which can be inserted and removed by leverage.

For the actuating element, this object is achieved with the characteristics of embodiments of the actuating element described in this specification and in the claims. This invention includes a front system, a flat module, and a component support.

A third switched position of the locking element is provided for the actuating element of this invention, in which the actuating lever of the actuating element continues to be maintained in a first position, which corresponds to a levered-in state of the flat module, wherein a relief of an integrated positioning element occurs. Thus, a total of at least three switching positions A, B and C are provided for the actuating element of this invention, by which a relief of an integrated positioning element occurs without a simultaneous release of the locking of the actuating lever. In this way an actuation, such as a first switching position and a relief, such as a second switching position, of the integrated positioning element can be performed by adjusting, in particular by the displacement, of the locking element into two switching positions A and C, without a release of the locking of the actuating lever occurring as in the switching position B.

While levering the actuating lever out, initially the actuation of the positioning element is canceled when the locking element is displaced from a first switching position A, actuation of the positioning element and locking of the actuating lever, into a center switching position C in particular, wherein the locking of the actuating lever continues. Only when the locking element is displaced into a switching position B, the locking of the actuating lever is canceled and the released actuating lever can be rotated for levering-out the flat module.

For structurally realizing the described separate and successive action of locking, or releasing the actuating lever and actuating or relieving the positioning element, the locking element has a switching slide for actuating a switching lever of the switching element, as well as locking members, in particular a sliding edge which slides along a corresponding sliding detent of the actuating element and either contacts it, in which case the actuating lever remains locked, or releases it, where the actuating lever is also released and can be rotated in preparation for removing the flat module by leverage.

A front plate with at least one actuating element, in accordance with this invention, is provided for the front system of this invention. Furthermore, a flat module has a front system with an actuating element in accordance with this invention. Finally, this invention includes a component support, into which flat modules with a front system in accordance with this invention can be inserted and from which they can be removed by leverage.

BRIEF DESCRIPTION OF THE DRAWINGS

This invention is explained in greater detail in view of exemplary embodiments in the drawings, wherein.

DESCRIPTION OF PREFERRED EMBODIMENTS

Figure 1:
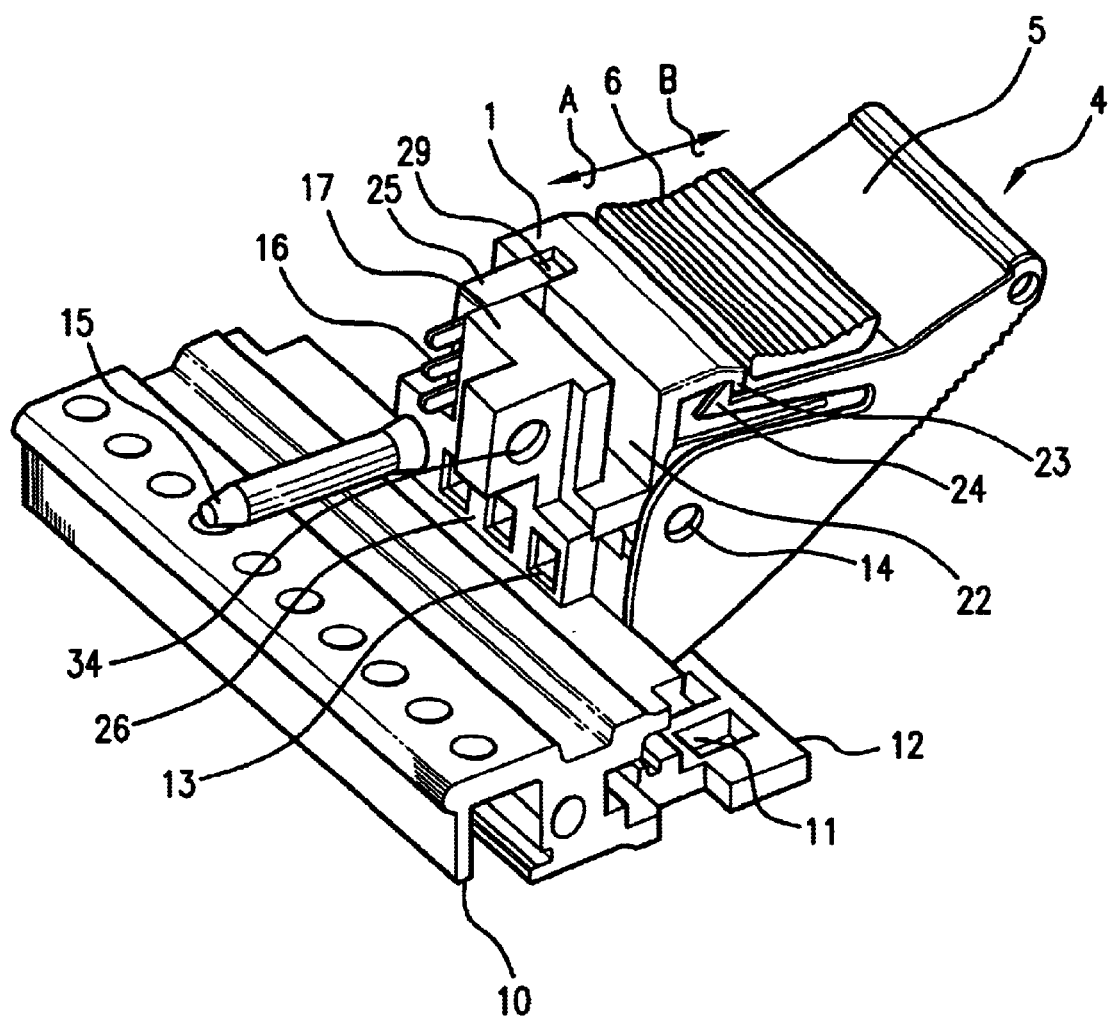
FIG. 1 is a perspective lateral view of a basic embodiment of an actuating element in accordance with the prior art.
Figure 2:
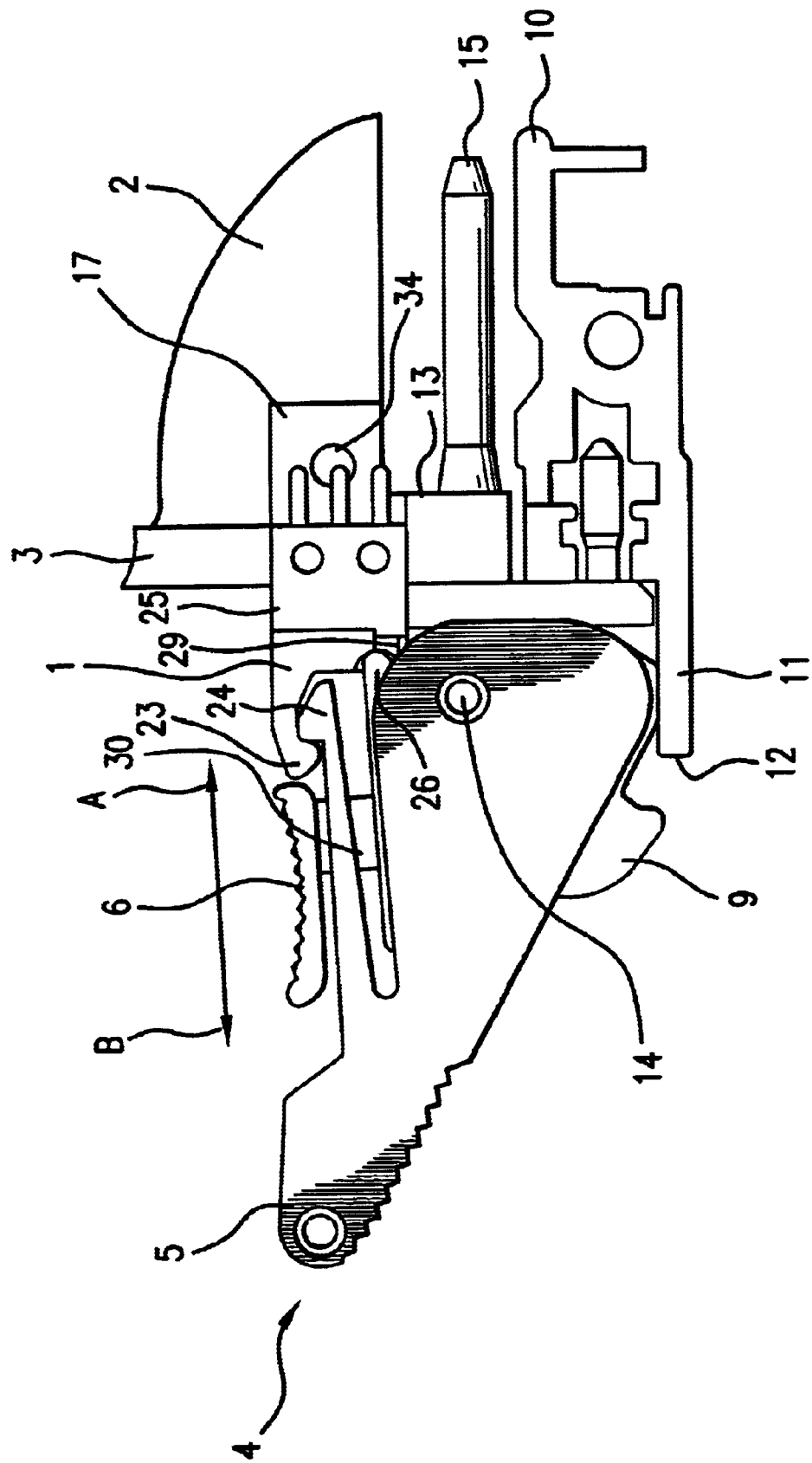
FIG. 2 is a lateral view of a front system for a flat module having an actuating element in accordance with the prior art shown in FIG. 1.

An actuating element in accordance with the prior art, for inserting and removing a flat module 2 by leverage, having an end element 1 for connection with the flat module 2 and a front plate, is shown in FIG. 1 and FIG. 2.

Here, the actuating element rests on a lower transverse rail 10 of a component support and has as its main components an actuating lever 4, an end element 1 and a front plate 3, not shown in FIG. 1 for reasons of clarity. In this case the end element 1 has a central retaining function, because it is used as a support for the actuating lever 4, which is rotatably seated in particular in a bore 14. The end element 1 can also be used for retaining the lower end of the front plate 3, which for this purpose is advantageously pushed into a groove 22.

The connection between the lower end element 1 and the front, lower edge of the flat module 2, as shown in FIG. 2, is preferably made via a retaining block 17 by a screw engaging a bore 34.

Finally, other components can also be attached to such an end element 1. The end element I represented in FIG. 1 contains a coding block 13, in which coding chambers 27 for the insertion of coding pins, not shown, are cut. These can engage coding chambers attached oppositely at the lower transverse rail 10, which have complementarily coded coding pins. It is thus possible that only one definitely selected flat module 2 can be positioned in a plug position of a component support. Finally there is also a guide pin 15 which, following engagement in an oppositely located, not illustrated guide bore, assures the insertion of the flat module 2 in a tilt-free correct manner.

The actuating lever 4, which can be worked by operating the handle element 5 when the actuating element 6 is moved into the switched position (B), is used for inserting or removing the flat modules 2 by leverage into or out of the corresponding plug position.

During levering-out it is necessary to push the actuating lever 4 down, so that at least one levering-out projection 9 protruding from the underside can be supported on a front edge 12 of the lower transverse rail 10. For reversing this, it is necessary in the course of levering-in to push the actuating lever 4 upward, so that at least one levering-in edge 8, also projecting from the underside, can be supported inside at least one engagement depression 11 also located in the area of the front edge 12 of the lower transverse rail 10.

The end element 1 allows the actuating lever 4 to be fixed in place in the appropriate position after reaching the state in which it is completely inserted into the flat module 2. Thus, the actuating lever 4 advantageously has a resilient, upward extending detent protrusion 24 on its top, which is directed toward the end element 1 and extends behind a detent edge 23 on the end element 1 which is directed toward the actuation lever 4 and extends downward.

In the same manner a corresponding arrangement is attached to the corner area of the flat module 2, shown in FIG. 2, which has an upper end element 3 with an actuating lever 4 rotatably seated thereon. The latter then engages a corresponding upper transverse rail of a component support, not represented, for levering-in and levering-out.

A positioning element 25 is integrated in the lower or upper end element of the actuating element in accordance with the prior art shown in FIG. 1 and FIG. 2, which is actuated by means of the actuating lever 4 when it is in its fixed position or switched position A. Thus, it is possible to electrically clear the flat module 2 attached to the actuating lever 4, for example by activating its current supply. In the other way the flat module 2 can also be switched electrically passive because the moment the flat module 2 is levered out the action of the actuating lever 4 on the positioning element 25 integrated into the end element 1 ends, and the electrical current supply for the flat module 2 is passivated again by the release of the positioning element 25.

The positioning element 25 is seated in a receiving slot 28 extending as far as the area of the detent edge 23 of the end element 1. Thus a switching element of the positioning element 25, for example a switching lever 29, projects into the area below the downward sloping detent edge 23 and, when the fixed state of the actuating lever 4, switched position A, is reached, it is actuated by the switching slide 26 of the locking element 6 of the actuating lever 4 when the actuating lever 4 is in position A. The locking element 6 is connected with the switching slide 26 via a connecting element 30.

If the actuating lever 4 is displaced into the position B, as shown in FIG. 2, the switching element 29 is relieved and the positioning element 25 is switched into a second switched state, whereupon a passivation of the flat module 2 occurs.

The levering-out of the actuating lever 4 can thereafter take place because its handle element 5 is moved downward, in the direction of the transverse rail 10, so that the detent projection 24 of the actuating lever 4 is resiliently released from the detent edge 23 of the end element 1. The positioning element 25 can be activated or passivated by displacing the locking element 6 between the positions A and B in FIG. 2, and this is independent of the complete release of the actuating element by the described downward levering-out of the actuating lever 4 for removing the flat module 2 from the component support.

Further details regarding the structure of the actuating element in accordance with the prior art in FIGS. 1 and 2, and in particular regarding the functioning of the locking element 6, ensue from German Utility Model Application 299 22 725.1, the content of whose disclosure is explicitly incorporated into this specification.

The integrated positioning element 25 can be advantageously electrically connected with the flat module 2 by a cable or cable-plug connector, which can be attached to its connecting contacts 16.

Thus it is possible to operate the positioning elements 25 always dependably and wear-free by means of the actuating element if the switching means of the positioning element 25 have only a very short switching path.

Since the active-passive switching function is completely integrated into the actuating element, users of the front system are not subjected to any restrictions regarding the positioning of components on a flat module equipped with such a front system. In particular, no dimensionally exact position determinations with respect to electrical connections for the position element 25 are required.

Figure 3:
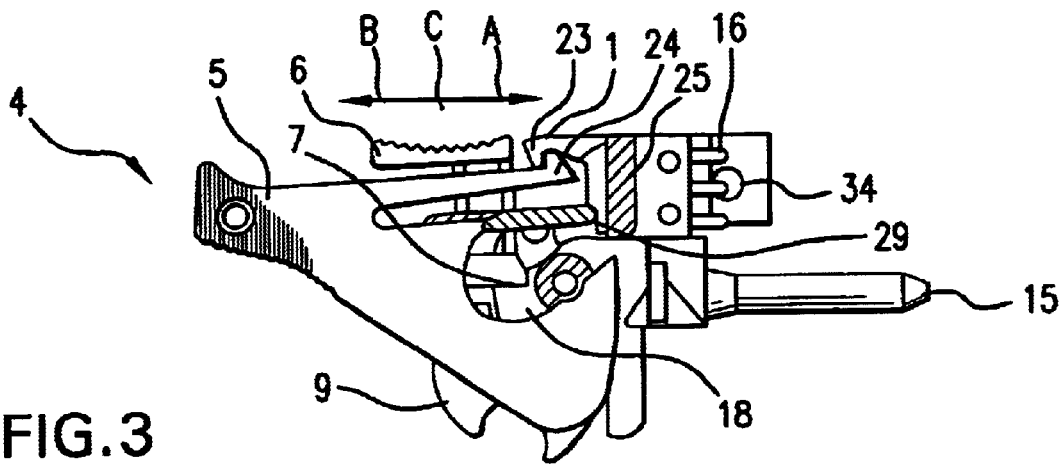
FIG. 3 is a lateral partial sectional view of an actuating element in accordance with this invention, with a locking element in switched position A.
Figure 4:
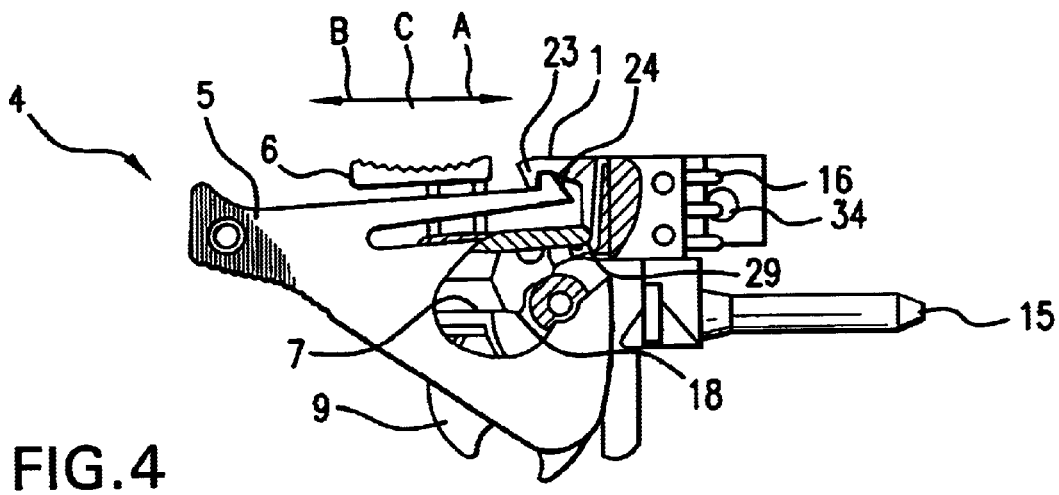
FIG. 4 is a lateral partial sectional view of an actuating element in accordance with this invention as shown in FIG. 3 with a locking element in switched position C.
Figure 5:
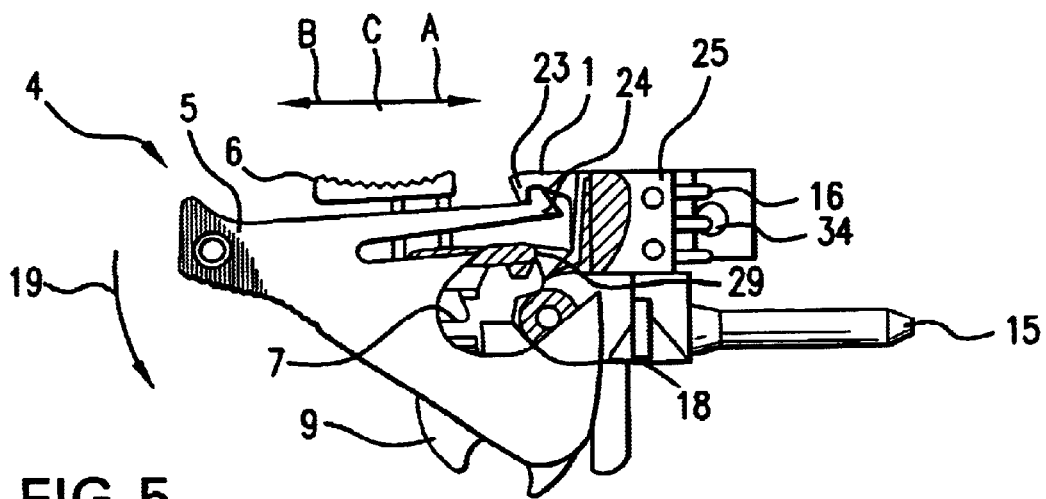
FIG. 5 is a lateral partial sectional view of an actuating element in accordance with this invention as shown in FIG. 3, with a locking element in switched position B.

To the extent the structure of the actuating system in accordance with this invention, in FIGS. 3 to 5, corresponds to the structure in accordance with the prior art in FIG. 1 and FIG. 2, identical reference numerals are employed, which have the functions represented in the description of FIG. 1 and FIG. 2 without needing supplementary explanations.

FIG. 3 represents a lateral partial sectional representation of an actuating element in accordance with this invention with a locking element in switched position A. In this case the switching lever 29 of the position element 25 is actuated by a switching slide 26 of the locking element 6, the first switched state, by which the flat module 2 connected with the positioning element 25 is activated, for example. With the locking element 6 in the switched position A, a rotation of the actuating lever 4 in the direction of rotation 19 is simultaneously prevented, because its sliding edge 7 rests on the sliding detent 18. Thus, the actuating lever 4 is in a levered-in and locked position and the detent projection 24 of the actuating lever 4 has been snapped under the edge 23 of the end element 1.

In FIG. 4, the locking element 6 is in the switched position C. Therefore the switching slide 26 of the locking element 6 is also in a retracted position, so that the switching lever 29 of the positioning element 5 is relieved, in the second switched state. Thus the flat module 2 is passivated, for example. At the same time the sliding edge 7 of the locking element 6 continues to contact the sliding detent 18 of the actuating element, the same as in the switched position in FIG. 3. Thus it is still assured that the actuating lever is in a locked and levered-in position, and the detent projection 24 continues to be snapped in underneath the edge 23 of the end element 1.

FIG. 5 shows the locking element 6 in a switched position B, namely in a rear end position. Here, the same as in the switched position C in accordance with FIG. 4, the switching lever 29 of the positioning element 5 is still relieved, therefore the flat module 2 continues to be passive. In addition, because of the retracted position of the locking element 6 in the switched position B, further contact of the sliding edge 7 with the sliding detent 18 is canceled. Therefore the actuating lever 4 can be moved in the direction of rotation 19, so that the detent projection 24 can be levered out of the positive connection with the edge 23 of the end element 1, and finally the flat module 2 can be levered out of the component support.

The flat module 2, the front plate 3, as well as the transverse rail 10, are not shown in FIGS. 3 to 5, and they correspond to FIGS. 1 and 2. To the extent that the actuating element in accordance with this invention is not differently described, with identical identifications its structure also corresponds to the structure of an actuating element in accordance with the prior art in FIGS. 1 and 2.

The sequence represented in FIGS. 3 to 5 makes it clear that a relief of the switching lever 29 of the position element 25 as shown in FIG. 4 can take place independently of the unlocking of the actuating lever 4 as shown in FIG. 5. Thus the user can definitely decide upon only an actuation or relief of the switching lever 29 of the positioning element 5, or whether the cancellation of the locking of the actuating lever 4 is also to be performed in the end.

What is claimed is:

1. In an actuating element for inserting and removing a flat module (2) by leverage, having an end element (1) prepared for connection with a flat module (2), and an actuating lever (4) rotatably seated on the end element (1) and having a handle element (5), a locking element (6) which can be adjusted between at least two switched positions (A, B) and which in a first switched position (A) maintains the actuating lever (4) in a first position which corresponds to a levered-in state of the flat module (2) and which releases the actuating lever (4) in a second switched position (B), the improvement comprising:
the actuating element having a positioning element (25) actuated in the first switched position (A) of the locking element (6), and the locking element (6) displaceable into a third switched position (C) in which the actuating lever (4) is maintained in the first position corresponding to a levered-in state of the flat module (2) and in which the positioning element (25) is relieved.

2. In the actuating element in accordance with claim 1, wherein the positioning element (25) is integrated into the end element (1) of the actuating element.

3. In the actuating element in accordance with claim 2, wherein the positioning element (25) has a switching lever (29).

4. In the actuating element in accordance with claim 3, wherein the locking element (6) has a switching slide (26) for actuating the switching lever (29).

5. In the actuating element in accordance with claim 4, wherein the locking element (6) has a sliding edge (7).

6. In the actuating element in accordance with claim 5, wherein the sliding edge (7) contacts a sliding detent (18) of the actuating element.

7. In the actuating element in accordance with claim 6, wherein when the sliding edge (7) contacts the sliding detent (18), and the actuating lever (4) is locked in the levered-in position.

8. In the actuating element in accordance with claim 7, wherein there is no contact between the sliding edge (7) and the sliding detent (18) when the locking element (6) is in the switched position (B).

9. In the actuating element in accordance with claim 8, wherein in a third switched position (c) of the locking element (6) the relief of the switching lever (29) of the positioning element (25) occurs with a continued locking of the actuating lever (4) in a first position corresponding to the levered-in state of the flat module (2).

10. In the actuating element in accordance with claim 9, having a front system for the flat module (2) which is attached to one end of the front plate (3).

11. In the actuating element according to claim 10, wherein the flat module (2) has the front system.

12. In the actuating element according to claim 10, wherein the flat module (2) with the front system is inserted and removed by leverage.

13. In the actuating element in accordance with claim 5, wherein there is no contact between the sliding edge (7) and the sliding detent (18) when the locking element (6) is in the switched position (B).

14. In the actuating element in accordance with claim 5, wherein in a third switched position (C) of the locking element (6) the relief of the switching lever (29) of the positioning element (25) occurs with a continued locking of the actuating lever (4) in a first position corresponding to the levered-in state of the flat module (2).

15. In the actuating element in accordance with claim 1, wherein the positioning element (25) has a switching lever (29).

16. In the actuating element in accordance with claim 1, wherein the locking element (6) has sliding edge (7).

* * * * *